United States Patent
Viswanathan et al.

(10) Patent No.: US 6,487,437 B1
(45) Date of Patent: Nov. 26, 2002

(54) DEVICE FOR HIGH GAIN AND UNIFORMLY LOCALIZED MAGNETIC RESONANCE IMAGING

(75) Inventors: Raju R. Viswanathan, Towson; Raghu Raghavan, Baltimore, both of MD (US)

(73) Assignee: Image-Guided Neurologies, Inc., Melbourne, FL (US)

( * ) Notice: Subject to any disclaimer, the term of this patent is extended or adjusted under 35 U.S.C. 154(b) by 0 days.

(21) Appl. No.: 09/532,145

(22) Filed: Mar. 21, 2000

(51) Int. Cl.$^7$ ............................................. A61B 5/055
(52) U.S. Cl. ....................................... 600/423; 128/899
(58) Field of Search ..................... 600/410, 422–424; 324/307, 309, 318, 321, 322; 128/897, 899; 604/19, 264, 280

(56) References Cited

U.S. PATENT DOCUMENTS

| | | | |
|---|---|---|---|
| 4,572,198 A | 2/1986 | Codrington | 128/653 |
| 5,271,400 A | 12/1993 | Dumoulin et al. | 128/653.2 |
| 5,357,958 A | 10/1994 | Kaufman | 128/653.2 |
| 5,938,599 A * | 8/1999 | Rasche et al. | 600/410 |
| 5,964,705 A | 10/1999 | Truwit et al. | 600/423 |
| 6,026,316 A | 2/2000 | Kucharczyk et al. | 600/420 |
| 6,061,587 A | 5/2000 | Kucharcyzk et al. | 600/411 |
| 6,280,385 B1 * | 8/2001 | Melzer et al. | 600/423 |

FOREIGN PATENT DOCUMENTS

| | | | |
|---|---|---|---|
| EP | 0928972 A2 | 7/1999 | G01R/33/28 |
| WO | WO 99/10035 | 3/1999 | A61M/25/00 |

OTHER PUBLICATIONS

Hurst, G.C., et al.: "Intravascular (Catheter) NMR Receiver Probe: Preliminary Design Analysis and Application to Canine Iliofemoral Imaging," *Magnetic Resonance In Medicine* 24 (1992) Apr., No. 2, pp. 343–357.

Atalar, E., et al., "High Resolution Intravascular MRI and MRS by Using a Catheter Reveiver Coil", *Magnetic Resonance In Medicine*, 36 (4), pp. 596–605, (Oct. 1996).

Martin, A.J., et al., "MR Imaging of Blood Vessels with an Intravascular Coil", *Journal of Magnetic Resonance Imaging*, 2 (4), pp. 421–429, (1992).

* cited by examiner

*Primary Examiner*—Shawna J. Shaw
(74) *Attorney, Agent, or Firm*—Mark A. Litman & Assoc. P.A.

(57) ABSTRACT

A microcoil configuration, preferably on a medical device to be inserted into a patient, has an opposed pair of microcoils. At least one or each microcoil of the opposed pair of microcoils has at least a region where a diameter circumscribed by a first winding is greater than the diameter circumscribed by at least one complete second winding, especially an adjacent winding displaced from the first winding along an axis or core of the medical device or an axis of the microcoil. The second winding is nearer to or farther from an intermediate region between the microcoils that define the pair of microcoils. For example, it is common to have a connecting (usually straight or non-wound) lead between the two microcoils, and this lead may be used to define an intermediate region. The microcoil configuration with varying circumference between windings (especially adjacent windings) is generally referred to as a dumb-bell or horn configuration because of its general appearance and the individual microcoils are referred to as a horn microcoil, again because of the visual appearance of the microcoil. The configuration of the microcoils assists in defining the properties of an RF responsive field adjacent to the device.

18 Claims, 4 Drawing Sheets

DEVICE FOR HIGH GAIN AND UNIFORMLY LOCALIZED MAGNETIC RESONANCE IMAGING

BACKGROUND OF THE INVENTION

1. Field of the Invention

This invention relates to medical devices for the reception of electromagnetic radiation. These devices are used (generally at radio frequencies) to obtain a high gain, uniformly wide field-of-view magnetic resonance image of a localized region within a natural organism (such as within a human). Medical devices may be used in conjunction with such magnetic resonance imaging devices, such as catheters and other devices for delivery of drugs and other therapeutic agents to areas of interest within the body or in an artificial environment.

2. Background of the Art

Throughout this specification, the term MR is used to mean "Magnetic Resonance" and "MR microcoil" is used to denote a magnetic resonance device used for imaging from within a patient. MR coils are conventionally used externally to the body in order to generate MR images, while the MR microcoil may be mounted at the tip of a catheter or other insertion device used commonly to probe the interior of a body so as to provide quick and direct access to the region where imaging is required. It is essential during the course of medical procedures such as image-guided and minimal access surgery, performed within small regions of a patient's anatomy, to be able to visualize the procedure being performed by the surgeon and the neighborhood of the anatomical region being treated surgically. While several methods, including x-ray imaging and fiber optic viewing offer possible alternative means of performing the visualization, magnetic resonance imaging methods are a particularly convenient means of doing this, especially given the highly localized nature of the procedures being performed. Extended x-ray exposures are harmful to the patient, and fiber optic viewing is not well suited either to viewing within small confines or to volume visualization. Both of these limitations may be circumvented by magnetic resonance imaging.

In addition, as described in U.S. patent applications Ser. Nos. 08/857,043 and 08/856,894 filed on May 15, 1997 now U.S. Pat. No. 6,026,316 issued Feb. 15, 2000 and U.S. Pat. No. 6,061,584 issued May 9, 2000, respectively, the use of improved Magnetic Resonance Imaging (MRI) techniques and devices enables a real-time visualization of compositional changes in the molecular composition of small regions within patients. The compositional changes may be caused by delivery of drugs or active chemicals, or by the stimulation of local chemical production by tissues or organs in the patient. MRI can actually enable visualization of minute concentration changes within the body, particularly intracranial regions of the patient.

U.S. Pat. No. 5,271,400 describes a tracking system for the position and orientation of an invasive device within a patient. The device includes a receiver coil and an MR active sample. The receiver picks up magnetic resonance signals generated by the sample. The frequencies are proportional to the location of the coil along the applied field gradients, since the signals are received in the presence of these magnetic field gradients. The system is designed to enable location of the invasive device and enhanced imaging of a region around the invasive device is not a functionality intended for this device.

In MR imaging of blood vessels with an intravascular coil', J. Mag. Res. Imag., 1992, Vol. 2, pages 421–429, A. J. Martin, D. B. Plewes and R. M. Henkelman describe an opposed solenoid design for an intravascular MR microcoil. This paper describes microcoils made of a pair of helical windings arranged in opposed fashion at the tip of a catheter, shown to be suitable for magnetic resonance imaging purposes. The term "opposed coil" means a coil in which the relative winding of two coil segments is opposite in sense, and the current flow in each opposed coil winds in opposite directions about the coil axis (relative to moving towards or away from the core or axis of the coil). That is, viewing the coils looking down an axis of the core around which the coils are disposed, one will be wrapped clockwise and the other will be wrapped counterclockwise, with a common lead between the two segments. The field-of-view of this coil is roughly cylindrical about the opposed solenoidal windings. The coil is essentially radio frequency insensitive beyond the longitudinal extent of the windings since the magnetic field in this design is squeezed out of the gap between the windings and is only significantly large in a cylindrical region that does not extend too far beyond this gap.

E. Atalar et al. describe a catheter receiver coil in 'High resolution MRI and MRS by using a catheter receiver coil', Mag. Res. Med., 1996, Vol. 36, pages 596–605. The gain of this coil falls off rapidly with distance from the coil so that noise levels in an image adjusted for the signal may still vary widely across the image. In addition, the gain (signal-to-noise ratio) provided by this design may be significantly improved upon by other means, such as in the invention described herein.

U.S. Pat. No. 5,271,400 describes a tracking system for the position and orientation of an invasive device within a patient. The device includes a receiver coil and an MR active sample. The receiver picks up magnetic resonance signals generated by the sample. The frequencies are proportional to the location of the coil along the applied field gradients, since the signals are received in the presence of these magnetic field gradients.

U.S. Pat. No. 4,572,198 describes a catheter for use with magnetic resonance imaging systems, the catheter including a wound coil for exciting a weak magnetic field at the catheter tip. This construction provides a local distortion of the MR image, yielding an image cursor on the magnetic resonance imaging display.

U.S. Pat. No. 5,964,705 describes an opposed solenoid design for an MR microcoil with helical windings whose pitch varies along the length of the winding with the aim of achieving homogeneity. However, the optimization method given there for finding a suitable pitch variation assumes a 'sheet current' distribution of the current along the catheter tip, which may not be realized in practice. Accordingly, the homogeneity of the field produced by the microcoil can be improved by other means, such as the invention described and claimed herein.

In summary, while microcoils for such internal imaging have been described before, the said device here has been designed specifically for very significant homogeneity of the radial magnetic field around the MR microcoil and a concomitant optimal sensitivity and signal strength of the received signal. This tends to provide a uniformly large field-of-view within which the said device provides a strong signal-to-noise ratio that is useful for imaging purposes.

A copending, commonly assigned application, filed the same day as this application, U.S. Ser. No. 09/532,037, in the name of Raju Viswanathan, titled A Microcoil Device with a Forward Field-of-View for Large gain Magnetic Resonance Imaging" describes a microcoil configuration wherein a device to be inserted into a patient comprises a solid body having at least one microcoil physically associated with the solid body, each microcoil having an outside microcoil diameter of 6 mm or less and a common axis, with at least one microcoil physically associated with the solid body at a distal end, at least 50% of individual windings of said each microcoil intersecting a geometric plane perpendicular to said common axis.

BRIEF DESCRIPTION OF THE INVENTION

A microcoil configuration, preferably on a medical device to be inserted into a patient, has an opposed pair of microcoils. At least one or each microcoil of the opposed pair of microcoils has at least a region where a diameter circumscribed by a first winding is greater than the diameter circumscribed by at least one complete second winding, especially an adjacent winding displaced from the first winding along an axis or core of the medical device or an axis of the microcoil. The second winding is nearer to or farther from an intermediate region between the microcoils that define the pair of microcoils. For example, it is common to have a connecting (usually straight or non-wound) lead between the two microcoils, and this lead may be used to define an intermediate region. The microcoil configuration with varying circumference between windings (especially adjacent windings) is generally referred to herein as a dumb-bell or horn configuration because of its general appearance and the individual microcoils are referred to as a horn microcoil, again because of the visual appearance of the microcoil.

DETAILED DESCRIPTION OF THE INVENTION

The detailed description in the following makes reference to the accompanying drawings which form a part hereof, which are included for illustration of the specific embodiments in which the invention may be practiced. These embodiments are described in sufficient detail to enable those skilled in the art to practice the invention, and it is to be understood that other embodiments may be utilized and that structural, configurational, logical, physical, architectural and electrical changes may be made without departing from the spirit and scope of the present invention.

Figure 2:
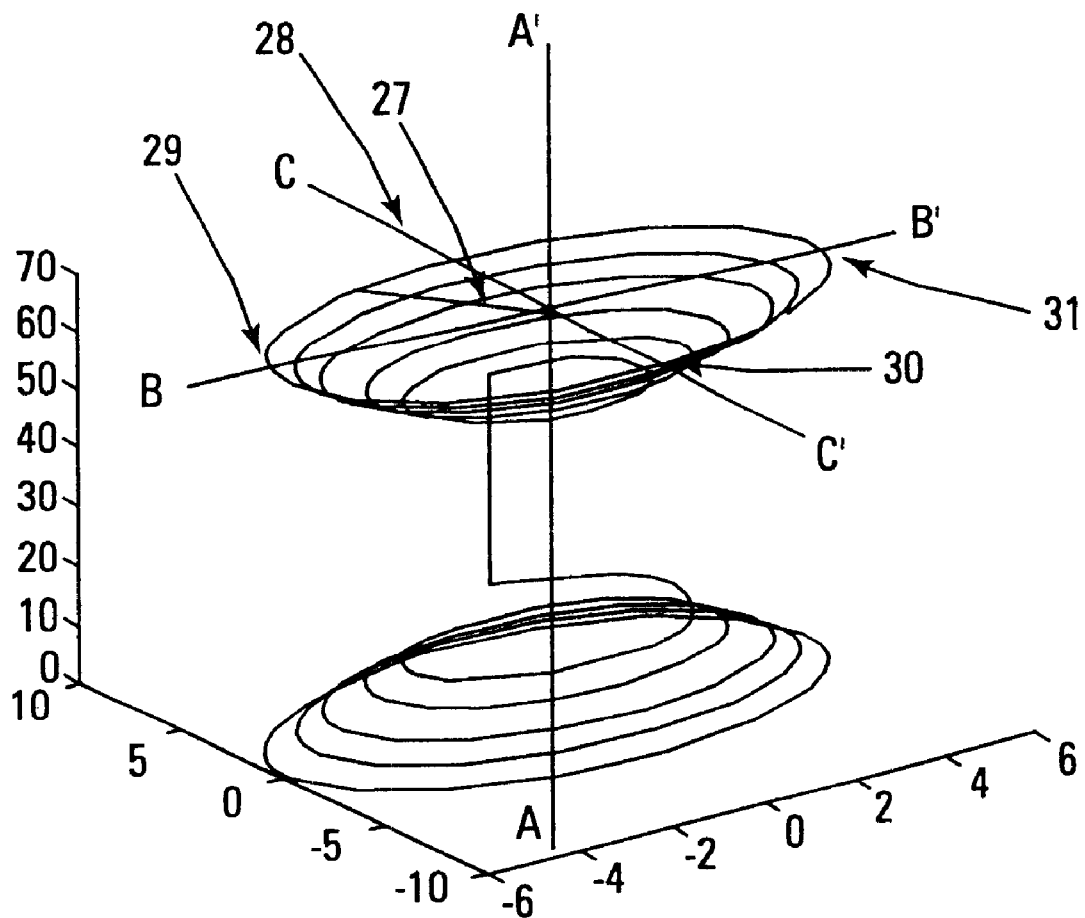
FIG. 2 shows a three-dimensional plot of the microcoil geometry where the varying cross section of the microcoil is easily discernible.

The practice of certain aspects of the present invention are applicable to all medical devices which might be used with magnetic resonance imaging-based viewing procedures occurring concurrently with the primary medical procedure. Features of the present invention which may individually have this general applicability within the medical device field include the types of RF-responsive coils and associated circuitry provided to medical devices to assure their MR-compatibility, and means for directing the said microcoil within or with a catheter device. The preferred construction uses a pair of opposed, non-uniformly-cylindrical coaxial coils with varying cross section and separated by a space, with the current flowing in opposite (rotationally angularly opposite, not linearly opposite with respect to the axis of the center of the microcoil or catheter) senses in the two coils. The two opposed coils may be connected by a bridging conductor (also referred to herein as an intermediate zone) so that the entire configuration is built from a single conductor. Thus, when that configuration is viewed from one end of the common coil axis, the currents in the two coils are such that the current direction in one of the coils is clockwise around this axis and that in the other is anticlockwise (counterclockwise) around the axis. This is due to the opposite sense of winding of the conductor used in the coils. Although this opposite sense of windings is generally used in the constructions of the present invention, it is clearly possible to further alter the structural configurations (and hence the resultant field) by other configurations still using a horn shaped microcoil(s). For example, the connections have been heretofore specifically described as between a pair of microcoils from interior to interior sections or leads of the individual microcoils (as shown in FIG. 2, between the smallest windings of both microcoils). In alternative embodiments still characterized by the presence of at least one horn-shaped microcoil, the electrical connection between adjacent microcoils or separate electrical leads to adjacent microcoils, at least one of which is horn-shaped, may comprise connectors from exterior-to-exterior positions of the microcoils, interior-to-exterior positions, or exterior-to-interior position on adjacent microcoils. For example, the connections may be between a largest diameter position winding on a microcoil to the smallest diameter winding on an adjacent microcoil, or between the largest windings of both microcoils or between the smallest windings on the adjacent microcoils. The visible appearance along an axis (e.g., A–A') would 'see' the coils as a) clockwise and counterclockwise, b) clockwise and clockwise, c) counterclockwise and counterclockwise or d) counterclockwise and clockwise when constructed from amongst these various mechanisms of electrical interconnection between adjacent microcoils or with separate electrical connections among the microcoils. For example, when an electrical contact was from EXTERIOR-TO-INTERIOR OR INTERIOR-TO-EXTERIOR (and passing over one of the coils), the horn shape would exist with a visual and electrical same sense orientation.

As noted earlier, there maybe a single horn shaped microcoil, a pair of adjacent microcoils where at least one is horn-shaped, a pair of microcoils where both are horn-shaped, multiple pairs of microcoils in which at least one microcoil or microcoil pair is horn-shaped, and the like. Each use of a horn-shape microcoil will alter the response field in the novel manner described herein.

A unique feature of the present invention is the non-cylindrical nature of the horn-shape microcoil and the winding due to the changing winding radius along the coil axis. This permits designing the field for maximal homogeneity within a cylindrical spatial region surrounding the coil and allows for more variations among vertical and horizontal spacing of the windings and degrees of control over the shape of the responsive field. While many alternative variations of the winding radius are possible, a radius variation in which the radius is greatest at the outer end of each coil of the opposed coil pair and is least at the inner end of each coil is found to be most optimal. There may be some 'collapse' (or reduced winding diameter) at the large end of the horn or a bulge at the smallest end of the horn, without any significant variation from the practice of the present invention. In fact, such geometries may be necessary because of design issues in certain medical instrument constructions. The envelope of the winding profile is horn shaped in this configuration. The shape of this horn may be chosen to follow different profiles, although that of a quarter sine wave is most preferred. The lack of a perfect, uniform, traditional, tubelike cylindrical nature of the microcoil winding in the present invention, which novel configuration produces magnetic field lines whose radial components outside the microcoil are distributed over and around a significant proportion of the length of the microcoil, is a findamental principle behind the present invention, and may be efficiently used to yield a significantly uniform field profile, constituting a substantial advance in the design of such devices. This unique design may be used in combination with other design and structure variables within the coil, microcoil and winding configurations. Among the non-exclusive design variations that may be used are a) variable winding thickness, b) variable diameters, c) variable winding translation and separation along the microcoil axis, d) varying rate of diameter increase along the microcoil axis, e) the number of microcoil pairs, f) and the combination of different microcoil geometries in combination with at least one horn-shape microcoil.

An important area of application of the said device is the visualization and monitoring of small quantities of drugs and other therapeutic agents, including those used in gene and cell therapies, moving through the tissue volume surrounding the said coil device (as disclosed in the copending application described herein), U.S. Pat. No. 6,026,316.

There are certain terms used in the description of the present invention that should be defined to assist in a better understanding of the invention. A coil or microcoil is a set of wires or electrical elements forming a continuous conducting path around a device. The coils or microcoils comprise at least windings or wires that form the structural content of the coils or microcoils. The windings or wires have a thickness (which can be referred to as a diameter or cross-section, but will be referred to as a thickness) and the windings as they form the coils or microcoils form shapes that have a diameter (loci of distances) about a core or axis of the device around which the windings pass. The space between adjacent windings can be measured in three different ways. The space between windings can be measured linearly along the axis of the core of the windings (equivalent to measuring the Z value in a two dimension graph), by vertical separation (equivalent to measuring the Y value in a two dimensional graph), and by direct linear separation (equivalent to measuring the literal distance between points on a two dimension graph [e.g., {the distance may be physically measured of by taking the square root of $(Z_1-Z_2)^2+(Y_1-Y_2)^2$}]). The three different distances shall be referred to as the Z distance, the Y distance and the literal distance, respectively. As the windings move along the Z direction, their diameters at any point along the winding (with respect to the axis of the microcoil or device) vary from adjacent windings at the same rotational position (an angle of rotation, clockwise or counterclockwise, with respect to a reference 0° position looking down the axis of the coil or microcoil). When the term diameter of a winding or diameter of a single wrap of the microcoil is used, that diameter can be measured (especially in comparison to the adjacent winding diameter) at a specific angle or rotation (with the same angle of rotation used in comparing adjacent winding diameters) or by averaging (by integration) the diameter of a complete encircling of the axis by a winding. These terms will be referred to herein as adjacent diameters and average,diameters, respectively. The Z distance between adjacent windings within a microcoil will be referred to herein as a frequency, expressed as either distance (that is distance between windings) or as windings per linear Z distance.

One general description of the present invention may be as a device for use within an organism, the device comprising an element having at least one pair of opposed RF receiver microcoils having a space (usually measured along the Z axis, parallel to the axis of the microcoil or core of the device) between each microcoil of the pair of microcoils. The coils of the microcoils comprise at least one adjacent pair of windings on at least one microcoil in which a diameter of one winding on the at least one microcoil increases in winding diameter with respect to a diameter of an adjacent winding. This increase in adjacent diameter is seen as adjacent windings are compared along the Z axis. Increased benefits are obtained when at least some progressive windings have progressively increasing diameters in this construction. It is not essential that every winding in the series of windings that form the microcoil increase in average diameter as compared to the average diameter of the adjacent winding. The increases may be in step form, with one or two adjacent pairs of windings having the same diameter, or even one pair decreasing in average diameter as the general trend of the windings is to increase in average diameter. The device may, for example, comprise a catheter having at least one lumen, and the at least one horn-shape microcoil or the at least one pair of microcoils is radially located about the at least one lumen and the windings have thicknesses of greater than 0.1 mm. At least some of the windings may have a diameter of greater than 0.1 mm and less than 2.4 mm. A particularly useful device has at least one drug delivery port present within said device. A particularly good location for the at least one drug delivery port is a position where at least some drug which is delivered through the port is delivered away from the device within a space between said pair of opposed microcoils. One additional design benefit is to have at least some microcatheters present within said device which extend outside of said device to deliver at least some liquid material within a volume bordered by planes extending radially from the catheter (at ends of the at least one pair of microcoils). The volume where the liquid material could be defined as between these planes, the surface of the catheter and a distance of anywhere from 0.1 to 6 mm from the surface of the catheter (thereby defining an annular volume). This volume where the liquid material is to be delivered defines a delivery space between each microcoil within said at least one pair of microcoils. A slope or gradient may also be measured on the horn microcoil by passing a line (with the most appropriate geometric averaging) through a point on each coil at the same rotational angle. The slope of the line drawn through points on the windings may, for example only, be between 5 and 85 degrees, between 10 and 80 degrees or between 15 and 80 degrees with respect to the axis of the coil. Other ranges such as between 5 and 70 degrees, between 10 and 60 degrees, and the like may also be used as the slope of the horn shape.

The device, in response to radiofrequency transmission, generates a reception field which has a more uniform transverse field strength within said volume bordered by planes than in a comparable volume surrounding a catheter having equally spaced windings of similar winding diameters (that is, the average winding diameters of all windings are the same). At least one horn-shape microcoil or at least one pair of microcoils may be embedded within a binder material that surrounds said lumen. At least one pair of microcoils may be electrically connected to a preamplifier within a portion of said device that may be inserted into an organism. That is, the location of the preamplifier is such that when the device is inserted into the body of a patient, the preamplifier is also inserted along with the device. As a result of some desirable methods of construction of the circuitry (e.g., photolithographic etching and deposition, mask sputtering, electrodeposition, and other like positive or negative imagewise deposition or removal of materials), electrical connections may be present and at least some of the electrical connections may have been formed in situ within the device.

Another way of describing a device of the present invention is as a device for use within an organism, the device comprising an element having at least one pair of opposed RF receiver microcoils having a space between the pair of microcoils. The RF receiver microcoils each comprise at least three individual windings. The at least three individual windings of said microcoils having diameters so that adjacent windings have winding diameters that increase by at least 1% with respect to an adjacent winding. The diameters may increase by at least 2%, at least 4%, at least 8%, at least 10% or more between adjacent windings, with the total increase in diameters from the smallest average diameter to the largest average diameter being from 5 to 200%, with any intermediate value (e.g., 8%, 15%, 25%, 50%, 75%, 100%, 150%, etc.) being useful.

Figure 1:
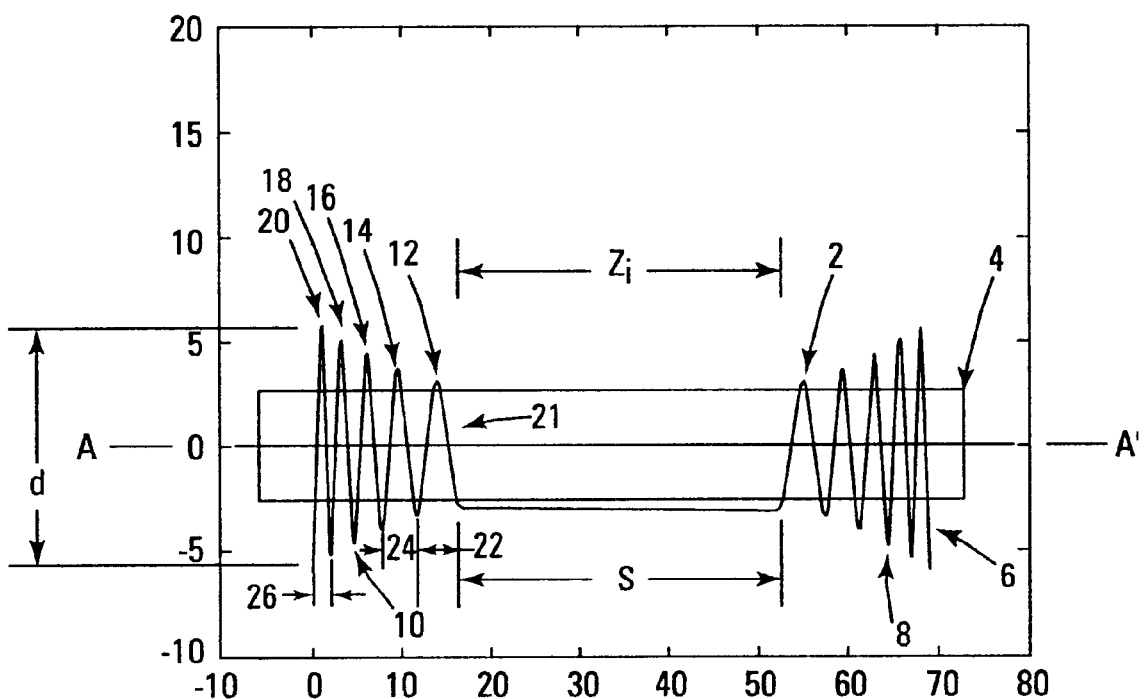
FIG. 1 shows a side view of one embodiment of a microcoil according to the present invention described in detail a below.

FIG. 1 shows a side view of the preferred coil geometry; other choices are possible for the variability of the radius. A medical device 2 is shown comprising a catheter 4 and a microcoil element 6. The microcoil element 6 is shown to comprise a pair of opposed microcoils 8 and 10 (although a single horn could be used, alone or in combination with a microcoil of a different configuration, such as concentric windings in an approximately planar configuration or a set of windings of coequal diameters wrapped in sequence about the core, or a series of windings being spaced as one of the windings in the pair of opposed microcoils in U.S. Pat. No. 5,964,705). These shown two horn-shaped microcoils 8 and 10 are generally disposed about an axis comprising the catheter 4 and the axis A–A' of the catheter 4. Looking directly down the axis A–A', one coil (e.g., coil 8) would appear to move in a counterclockwise direction about the axis A–A', while looking the same direction down the axis A–A', the other microcoil 10 would appear to move in a clockwise direction about the axis A–A'. Microcoil 10 is shown with five (5) windings (12, 14, 16, 18 and 20) or complete rotations of the wires 21 that comprise the microcoil 10. The diameter d of the last, outermost winding 20 is shown as the outermost distance (away from the axis A–A') attained in two opposite apogees in the traversal of the wires 21 in forming one complete (360 degrees) angular rotation of the windings (12, 14, 16, 18 and 20) of the microcoils around the core. At least two of the diameters of adjacent windings (within 12, 14, 16, 18 and 20) are different, with at least one pair of adjacent windings (within 12, 14, 16, 18 and 20) being of different diameters. As determined from their respective distance from an intermediate zone Zi, at least some adjacent microcoil windings should have increased diameters as they are farther from the intermediate zone Zi. The intermediate zone Zi in this Figure is shown as an electrical bridge between the two microcoils 8 and 10. It is preferred that each microcoil (e.g., 8 and 10) have at least three windings that increase in diameter as the windings move farther from the intermediate zone Zi, but there are no absolute upper limits to the number of windings, although certain uses might find 10, 20, 30 or fifty windings to be reasonable limits in combination with the minimum of three windings.

In FIG. 1, it is also shown as an option in the practice of the present invention, as shown in U.S. Pat. No. 5,964,705, the frequency or spacing (22, 24 and 26) between adjacent windings (e.g., within 12, 14, 16, 18 and 20) may be different, and in this FIG. 1 are shown with the distance (22, 24 and 26) between adjacent windings (e.g., within 12, 14, 16, 18 and 20) decreasing as the windings are positioned farther from the intermediate zone Zi. The frequency may also decrease (the separation increasing) and the diameter of the windings may decrease between adjacent windings (e.g., within 12, 14, 16, 18 and 20) as the windings are positioned farther from the intermediate zone Zi as an option for special configurations and uses, or the windings may both increase and decrease in frequency and diameters for other configurations.

As is noted in FIG. 1, a space S between microcoils is most conveniently measured along a straight line of the winding, at points on the winding with approximately the same angle of rotation and where the windings are no longer oriented in a path circumscribing the axis A–A'. The points from which this measurement is taken is an approximation of an end of a microcoil, with no further wrapping of the wire about the axis A–A'.

In FIG. 1, the first coil starts to wind from a larger radius $r_1$ to a smaller radius $r_2$ with the difference between the two radii preferably ranging approximately from $0.1r_1$ to $0.7r_1$, or being represented by an at least 4% change, at least 5% change, at least 10% change, or a change of from 10% to 70% between either adjacent windings or amongst a gradiently changing group of windings in a series. The radius $r_1$ may be chosen to be as small as 0.5 mm or as large as 4 mm. While this is a preferable range for many applications, some applications may use values outside this range. As seen from the end of the coil corresponding to the larger radius, the sense of winding of the first coil is clockwise around the common coil axis. There must be at least two complete windings, usually at least three or at least four windings, and any number of windings may be used (e.g., up to 6, 8, 10, 20, and the like) with diminishing returns being eventually met. FIG. 2 illustrates the sense of winding of the first coil with an end view of the same. The bridging conductor between the coils runs for a length that preferably lies in the approximate range $r_1$ to $8r_1$. The second coil starts winding in an anticlockwise sense beginning from a radius of $r_2$ with the winding radius then increasing to the value $r_1$. The radius of the helical winding in each coil may increase or decrease steadily or in stepwise fashion. Furthermore, the pitch of the winding, or the distance along the axis between two successive turns of coil, may vary along the length of each of the coils. The pitch of the very first turn of coil may range from t to $r_2$, where t is the width of the conductor used in the coil. In the design shown, the pitch of each successive turn of coil increases in geometric fashion from the outer end to the inner end. This geometric ratio of successive pitch lengths may vary preferably in the approximate range from 1 to 3.5, with increasing pitch from outer to inner end being preferred. The variation in radius, as stated earlier, could preferably take various generally horn shaped forms. It is found that a choice that is useful for producing homogeneous field patterns is a sinusoidal variation of the radius of each coil in the coil pair, preferably in the form of a quarter sine wave profile. One such choice is described here for illustrative purposes, although many variations are possible, including the use of circular or almost circular turns with stepped changes in the winding radius. An important consideration to be kept in mind is the change in cross section of the winding. After a series or number of windings have met this criteria of increasing in diameter as the microcoil moves closer towards an end of the device, one or more windings may then remain constant in size or even decrease in size to modify the receptive field effects as desired.

With a choice of coordinate system such that the coil's axis points along the z-direction, the helical winding of the first coil may be represented by the equations $$x(\theta) = -r_1(\theta)\sin\theta \quad (1)$$

$$y(\theta) = r_1(\theta)\cos\theta$$

$$z(\theta) = p\frac{\alpha^{\theta/2\pi} - 1}{\alpha - 1}$$

where θ is the winding angle around the coil axis, measured clockwise around the axis looking down the axis, and r is the winding radius where the winding of the coil begins. Here $$r_1(\theta) = r - a\sin\left(\frac{\pi z}{2l}\right)$$

where α is the difference in winding radii between the ends of the coil and l is the length of the coil. In the above p is the pitch of the first turn of the coil and α is the ratio of the pitch between successive turns, chosen here for illustrative purposes to be 1.25. The first coil extends along the z-axis from 0 to l. For n turns, θ goes from 0 to 2 nπ. The gap conductor bridging the gap between the two coils extends from $z_1=z(2\,n\pi)$ to a value $z_2$. The second coil is represented by the equations $$x(\phi) = r_2(\phi)\sin\phi \quad (2)$$

$$y(\phi) = r_2(\phi)\cos\phi$$

$$z(\phi) = \frac{p\alpha^n}{1-\alpha}(\alpha^{-\phi/2\pi} - 1) + z_2$$

where φ is the winding angle around the coil axis, measured anticlockwise around the axis looking down the axis. Here $$r_2(\phi) = r - a\cos\left(\frac{\pi(z - z_2)}{2l}\right)$$

is the winding radius at a winding angle of φ. A lead running parallel to the gap conductor may be attached to the far end of the coil so as to minimize the field distortion produced by the gap conductor. FIG. 1 shows a side view of the coil detailed above, with the sinusoidal variation in winding radius clearly visible. FIG. 2 depicts the coil shape in a three dimensional plot, where the opposed sense of winding in the two coils is made clear.

Although the above description discusses a single pair of opposed coils, it is possible to use multiply wound configurations while maintaining the horn-shaped profile of the windings. This is akin to using more than one pair of opposed coils, and may be especially useful when increased axial symmetry of the resulting magnetic field configuration is desired. For purposes of non-limiting example only, the distinct windings may satisfy the relationship:

$$x_j(\theta) = r_1(\theta)\sin(\theta + 2\pi j/M)$$

and so on, where there are M distinct coil pairs indexed by j=0, ..., (M−1). In this example the symmetrical arrangements of the coil pairs relative to each other about the common coil axis results in a correspondingly more axially symmetric magnetic field configuration.

The sensitivity or gain of the coil is proportional to the component of the magnetic field that is transverse to the main field of a magnetic resonance imaging system, produced by unit current flowing through the coil. The magnetic field may be determined in a specified region surrounding the coil by using the Biot-Savart law:

$$B = \frac{\mu_0}{4\pi}\int \frac{dl \times r}{|r|^3} \quad (3)$$

with the integral taken over the entire length of the coil. Here B, dl and r are vectors: B is the magnetic field at a specified point in space, dl is a current-carrying length element and r is the distance vector from the current element to the specified point. A study of the distribution of the magnetic field around the coil is useful for assessing the uniformity of the field profile. For this purpose, we have mapped the radial component of the magnetic field along four lines parallel to the coil axis, all located at the same distance from the coil axis but at different orientations around it. In FIG. 2, looking down the coil axis A–A', let the coil winding start at an orientation defined to be the 6 o'clock orientation, and this orientation will be labeled C–C'. Then 9 o'clock (B–B'), 12 o'clock (C'–C) and 3 o'clock (B'–B) orientations are defined in clockwise fashion with orientation labels 29 (B–B'), 28 (C'–C) and 31 (B'–B), respectively. These orientations are marked in FIG. 2, where A–A' is the coil axis, and B–B' and C–C' are mutually perpendicular axes which are also orthogonal to A–A'. The shown winding angle 27 is then measured away from C–C', clockwise as seen looking down A–A', and 28, 29, 30 and 31 define the 6 o'clock, 3 o'clock, 12 o'clock and 9 o'clock orientations respectively, discussed just above.

Figure 3:
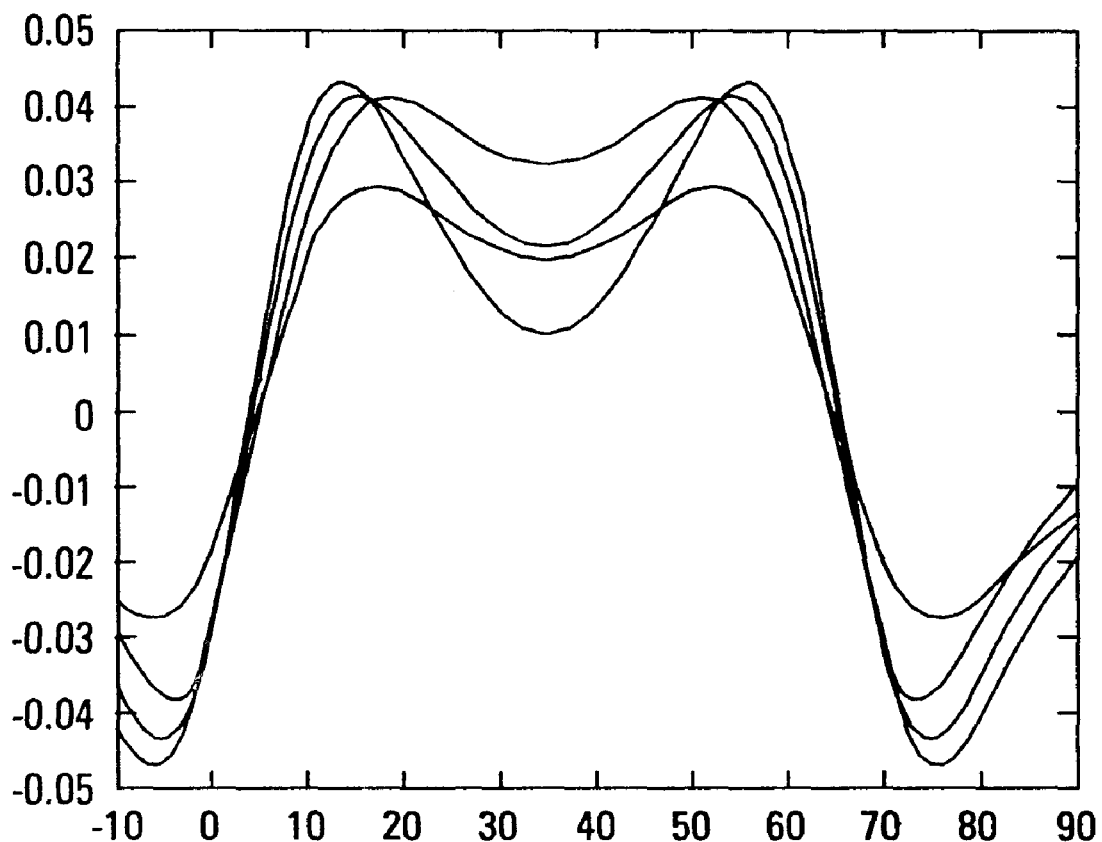
FIG. 3 shows plots of the transverse magnetic field profile at different orientations around the coil section, at a certain fixed distance (e.g., of three times the coil's outer end radius) from the coil axis.

We choose 4 lines parallel to the coil axis and situated about the coil axis at the above orientations, along which we evaluate the radial magnetic field. FIG. 3 shows the typical radial magnetic field profiles generated by the coil along four such lines parallel to the coil axis and at a distance of $3r_1$ from it, and the coil extending from 0 to approximately $14r_1$ in the axial direction. Due to the nature of the coil and the winding used, the transverse magnetic field is mostly radial.

Figure 4:
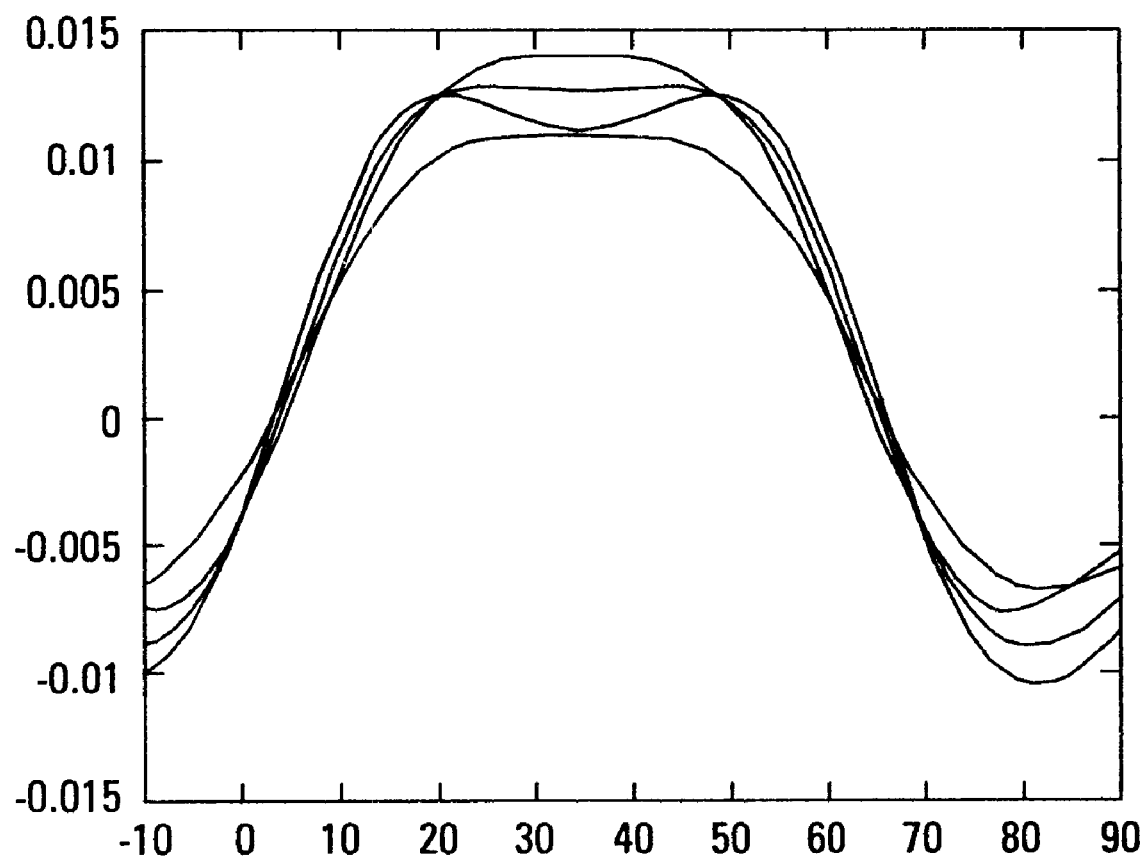
FIG. 4 shows plots of the transverse magnetic field at different orientations around the coil section, at a fixed distance (of five times the coil's outer end radius) from the coil axis.

FIG. 4 shows the radial field profile along lines at different orientations around the coil axis and parallel to it, at a distance of $5r_1$ from the axis. It can be seen that the field profile does not change very much around the coil, and is uniform over a substantial fraction of the length of the coil.

As noted above, assignee's have a copending application, U.S. Ser. No. 09/532,037, in the name of Raju Viswanathan, titled A Microcoil Device with a Forward Field-of-View for Large gain Magnetic Resonance Imaging." This application describes a microcoil configuration wherein a device to be inserted into a patient comprises a solid body having at least one microcoil physically associated with the solid body, each microcoil having an outside microcoil diameter of 6 mm or less and a common axis, with at least one microcoil physically associated with the solid body at a distal end, at least 50% of individual windings of said each microcoil intersecting a geometric plane perpendicular to said common axis. To assist in distinguishing any possibility of overlap between the claimed subject matter of that application and the subject matter of the present application, it should be noted that fewer than 50 number percent of windings in the practice of the present invention should intersect a single geometric plane perpendicular to a common axis between adjacent microcoils. In fact, fewer than 40%, fewer than 30%, fewer than 20%, fewer than 10% and 0% of windings within a single microcoil should intersect such a geometric plane perpendicular to said common axis.

The fabrication of the coil may be accomplished using many different methods familiar to those skilled in the art, including winding conducting wires or filaments of wire over a catheter tip whose cross sectional variation follows the horn profile, deposition and etching processes, masked deposition, microlithography, and such other techniques known to practitioners of the art, on different substrates, including flexible films, and possibly followed by rolling to achieve the final configuration of the coil geometry. The conductor may be of copper, silver, gold or other electrically highly conducting material possibly including alloys, composites or platings. The coil itself may be enclosed by or encased within tightly fitting protective or insulating material such as a polymer.

The number of turns in each of the opposed coils may range between 2 and 25, although preferably between 5 and 14. The width of the conductor used in the winding may range from 10 micrometers to 2 millimeters. The leads connecting to the ends of the coil may be arranged geometrically in such suitably convenient fashion as the specific application for which the invention is used demands.

What is claimed:

1. A device adapted for insertion within an organism during a magnetic resonance procedure, said device comprising: at least one pair of opposed, non-uniformly-cylindrical, coaxial RF receiver microcoils having a space between each microcoil of said pair of microcoils, at least one of the coils of said microcoils having at least one adjacent pair of windings on at least one microcoil in which a diameter of one winding on the at least one microcoil increases in winding diameter with respect to a diameter of an adjacent winding.

2. The device of claim 1 wherein said device comprises a catheter having at least one lumen, wherein both coils of said pair of microcoils have at least one adjacent pair of windings in which a diameter of one winding on the each microcoil in said pair of microcoils increases in winding diameter with respect to a diameter of an adjacent winding on that microcoil and said at least one pair of microcoils is radially located about said at least one lumen and said windings have diameters of greater than 0.1 mm.

3. The device of claim 2 wherein at least some of the windings have a diameter of greater than 0.1 mm and less than 3 mm.

4. The device of claim 3 wherein microcatheters are present within said device which extend outside of said device to deliver at least some liquid material within a volume bordered by planes extending radially from the catheter at ends of the at least one pair of microcoils which define a space between each microcoil within said at least one pair of microcoils.

5. The device of claim 4 wherein said at least one pair of microcoils is electrically connected to a preamplifier within a portion of said device.

6. The device of claim 3 wherein said at least one pair of microcoils is embedded within a binder material.

7. The device of claim 4 wherein said device, in response to radiofrequency transmission, generates a reception field which has a more uniform transverse field strength within said volume bordered by planes than in a comparable volume surrounding a catheter having equally spaced windings of similar winding diameters, so that the difference between maximum and minimum values of the transverse field strength produced by said device within said volume at a given radial distance from the coil axis is smaller by at least 20% than that for a catheter having equally spaced windings of similar winding diameters.

8. The device of claim 2 wherein at least one drug delivery port is present within said device.

9. The device of claim 8 wherein said at least one drug delivery port is located so that at least some drug to be delivered through said port is delivered away from said device within a space between said microcoils.

10. The device of claim 1 wherein said at least one pair of microcoils is embedded within a binder material which surrounds said lumen.

11. The device of claim 2 wherein said at least one pair of microcoils is electrically connected to a preamplifier within a portion of said device.

12. The device of claim 1 wherein electrical connections are present within said device and at least some of said electrical connections have been formed in situ within said device.

13. A device adapted for insertion within an organism during a magnetic resonance procedure, said device comprising: an element having at least one pair of opposed, non-uniformly-cylindrical, coaxial RF receiver microcoils having a space between the pair of opposed microcoils, said RF receiver microcoils each comprising at least three individual windings, said at least three individual windings of said microcoils having diameters so that adjacent windings have winding diameters that increase by at least 1% with respect to an adjacent winding close to the space between the pair of opposed microcoils.

14. The device of claim 13 wherein there is a space of at least 0.5 mm between each microcoil within said pair of opposed microcoils.

15. The device of claim 14 wherein there is an axial distance of at least 0.05 mm between windings within each microcoil.

16. The device of claim 14 wherein winding diameters of at least three adjacent windings in series increase by at least 10% with respect to an adjacent winding closer to the space between the pair of opposed microcoils.

17. A device adapted for insertion within an organism during a magnetic resonance procedure, said device comprising: at least one pair of non-uniformly-cylindrical coaxial receiver microcoils arranged in opposed fashion, the microcoils arranged in a multiply wound configuration about the coil axis, the microcoils having a space between each microcoil of said at least one pair of microcoils, at least one of the coils of said microcoils having at least one pair of adjacent windings on at least one microcoil in which a diameter of said at least one winding on the at least one microcoil increases in winding diameter with respect to a diameter of an adjacent winding.

18. The device of claim 17 wherein said at least one winding on at least one microcoil of said pair of microcoils increases by at least 3% in winding diameter with respect to a diameter of an adjacent winding.

* * * * *